United States Patent
Gunji et al.

(10) Patent No.: US 8,551,565 B2
(45) Date of Patent: Oct. 8, 2013

(54) FILM FORMING METHOD AND FILM FORMING APPARATUS

(75) Inventors: Isao Gunji, Yamanashi (JP); Hidenori Miyoshi, Yamanashi (JP); Hitoshi Itoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 281 days.

(21) Appl. No.: 12/811,185

(22) PCT Filed: Dec. 25, 2008

(86) PCT No.: PCT/JP2008/073546
§ 371 (c)(1),
(2), (4) Date: Jun. 29, 2010

(87) PCT Pub. No.: WO2009/087906
PCT Pub. Date: Jul. 16, 2009

(65) Prior Publication Data
US 2010/0316799 A1 Dec. 16, 2010

(30) Foreign Application Priority Data
Jan. 7, 2008 (JP) .................... 2008-000680

(51) Int. Cl.
*C23C 16/18* (2006.01)
(52) U.S. Cl.
USPC ............ 427/252; 427/248.1; 427/250
(58) Field of Classification Search
None
See application file for complete search history.

(56) References Cited

U.S. PATENT DOCUMENTS

| 5,106,462 A | 4/1992 | Kawakami |
| 5,498,824 A | 3/1996 | Johnson et al. |
| 2003/0165623 A1* | 9/2003 | Thompson ............ 427/376.1 |
| 2008/0000416 A1 | 1/2008 | Miyoshi et al. |

FOREIGN PATENT DOCUMENTS

| JP | 2745677 B | 12/1990 |
| JP | 2004-027352 A | 1/2004 |
| JP | 2007-332453 A | 12/2007 |
| KR | 1020060103538 A | 10/2006 |

OTHER PUBLICATIONS

Keller, Nature, V162, N 4119, p. 580, 1948.*
Edwards, Dalton Trans, 1973, p. 2463.*
A. Gupta and R. Jagannathan, Applied Physics Letters, 51(26), p. 2254, (1987).
A. Keller and F. Korosy, Nature, 162, p. 580, (1948).
International Search Report for PCT/JP2008/073546 mailed Mar. 17, 2009.
M. J. Mouche et al, Thin Solid Films 262, p. 1-6, (1995).

* cited by examiner

*Primary Examiner* — Joseph Miller, Jr.
(74) *Attorney, Agent, or Firm* — Abelman, Frayne & Schwab

(57) ABSTRACT

Disclosed is a film forming method including the steps of: producing a monovalent carboxylic acid metal salt gas by reacting a bivalent carboxylic acid metal salt with a carboxylic acid; supplying the monovalent carboxylic acid metal salt gas on a substrate to accumulate a monovalent carboxylic acid metal salt film; and decomposing the monovalent carboxylic acid metal salt film by supplying energy to the substrate formed with the monovalent carboxylic acid metal salt film so as to form a metallic film.

6 Claims, 10 Drawing Sheets

FILM FORMING METHOD AND FILM FORMING APPARATUS

This is a U.S. national stage application of International Application No. PCT/JP2008/073546, filed on 25 Dec. 2008. Priority under 35 U.S.C. §119(a) and 35 U.S.C. §365(b) is claimed from Japanese Application No. JP2008-000680, filed 7 Jan. 2008, the disclosure of which is also incorporated herein by reference.

FIELD OF INVENTION

The present invention relates to a film forming method and a film forming apparatus for forming a metallic film, such as a copper film, which is used as a wiring of a semiconductor.

BACKGROUND OF THE INVENTION

As a semiconductor device requires a high speed, miniaturization of a wiring pattern, and high integration, it has recently been required to reduce capacitance between wirings, and improve conductivity of a wiring and electromigration resistance. Accordingly, a technology on a copper multilayer wiring is spotlighted which uses a copper (Cu) as a wiring material having a higher conductivity and a higher electromigration resistance than aluminum (AL) or tungsten (W). The copper multilayer wiring technology uses a low dielectric constant layer (low-k layer) film as an insulating film between the layers.

As a copper film forming method of a copper multilayer wiring, there are known physical vapor deposition (PVD) such as sputtering, plating, and metal organic chemical vapor deposition (MOCVD) using a vaporized organic metallic raw material. However, the PVD method has a problem of a poor step coverage, and of a difficulty in embedding in a fine pattern. In the plating method, due to an additive included within a plating solution, the copper film includes a large amount of impurities. In the MOCVD method, while it is easy to achieve a good step coverage, it is difficult to improve film quality because a large amount of impurities, such as carbon (C), oxygen (O), fluorine (F), resulting from a side chain group coordinated to a Cu atom, remain in the copper film. Also, the raw material is relatively expensive because the side chain group coordinated to the Cu atom has a complicated structure. Further, due to the thermal instability and a low vapor pressure, it is difficult to stably supply a raw material gas.

Meanwhile, Japanese Patent Laid-Open Publication No. 2004-27352 (patent document 1) discloses a technology for forming a copper film, in which a CuCl plate is placed within a chamber, and is etched by generating Ar gas plasma so as to generate desorbing species of CuCl, and generate dissociation species of Cu and Cl from the desorbing species by Ar gas plasma. And then, the temperature of a substrate is reduced to lower than the temperature of the plate so as to form the copper film on the substrate by direct reduction. Through the technology, it is possible to use an inexpensive raw material with a high film-forming speed, and to form a copper film that includes relatively less impurities therein.

However, in the technology in the patent document 1, there is a concern that it is difficult to completely remove Cl in the copper film, and thus a trace element of Cl may remain in the copper film. Even a trace element of Cl may cause an increase in wiring resistance and a reduction in the reliability, accompanied by the corrosion of a copper wiring. Also, since a substrate surface is exposed to plasma at an initial stage of film formation, the substrate may be subjected to a chemical or physical damage. Especially, a Low-k film used as a wiring is likely to be subjected to an increase in a dielectric constant by the plasma, and destruction of a fine structure (plasma damage). Also, since the plasma sputters other members than the CuCl plate within a reactor, the sputtering causes a damage to the members, impurities in the film by sputtered particles, and contamination. Accordingly, the application of the technology disclosed in patent document 1 to the copper multilayer wiring has a problem in that it requires expensive devices or materials to solve the above described problems.

Meanwhile, thought it is not directed to a semiconductor manufacturing process, Japanese Patent No. 2745677 (patent document 2) discloses a method for manufacturing a copper wiring by using an inexpensive raw material which is different from a wet plating. In this method, an inexpensive organic Cu compound such as copper (II) formate ($Cu(OCHO)_2$) or a hydrate thereof, is applied to a substrate, and heat is provided thereto in a non-oxidizing atmosphere so as to form a copper thin film. Also, there is a report (non-patent document 1) on the formation of a copper wiring in A. Gupta and R. Jagannathan, Applied Physics Letters, 51(26), p 2254, (1987), in which copper (II) formate dehydrate applied to a substrate is heated by a laser beam with a narrowed beam diameter. All of the above described methods use a thermal decomposition reaction of copper (II) formate to form the copper film. In the above described methods, although it is possible to form a metal (Cu) film at a low cost, it is inappropriate to embed a metal in a nanometer-level fine shape, such as in an ultra large-scale integrated (ULSI) wiring, and the electric conductivity is not higher than that of original copper film.

There is a report on an attempt to use an inexpensive copper (II) formate hydrate as a raw material of MOCVD in M. J. Mouche et al, Thin Solid Films 262, p 1~6, (1995) (non-patent document 2). Powder of copper (II) formate hydrate is put into a raw material container and then is heated with an introduction of a carrier gas. The carrier gas carries a vaporized component generated by the heating, to the surface of a heated substrate disposed within another reactor via a pipe. The carried vaporized component is thermally decomposed on the substrate surface to generate a copper film.

It is known that the vaporized component generated within the raw material container is copper formate in A. Keller and F. Korosy, Nature, 162, p 580, (1948) (non-patent document 3). Also, according to the reaction scheme represented by Formula (1) below, a gas state copper formate (Cu(OCHO)) which is volatile is generated from non-volatile copper (II) formate, and is carried to a substrate:

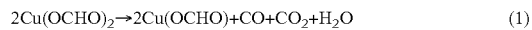

$$2Cu(OCHO)_2 \rightarrow 2Cu(OCHO)+CO+CO_2+H_2O \quad (1)$$

Since copper formate, as reported in non-patent document 3, is a material that can be thermally-decomposable very easily, a copper thin film is easily formed from copper formate at a low temperature according to the reaction scheme represented by Formula (2) below:

$$2Cu(OCHO) \rightarrow 2Cu+2CO_2+H_2 \quad (2)$$

According to this method, it is difficult for a formate group (OCHO) as a ligand to be introduced in the copper film because it is likely to be exhausted through thermal decomposition into $CO_2$ or $H_2$. Thus, it is easy to form a high purity copper film excluding impurities. However, in general, a method for carrying a component vaporized from a solid raw material by a carrier gas is significantly influenced by a thermal conductivity within a solid raw material container maintained under a reduced pressure. Furthermore, it is difficult to stably supply the vaporized component. Also, copper (II) formate as a raw material within the solid raw material container may be thermally decomposed, thereby forming a copper film in the container. In other words, the raw material may be easily deteriorated.

Also, according to the non-patent document 3, silver may be used as a metal which can form metal formate and can show the same reaction as that of copper, and may form a silver film as a wiring layer in the same manner as that in the copper film, but has the same problem as that in the copper film.

SUMMARY OF THE INVENTION

Therefore, the present invention has been made in view of the above-mentioned problems, and provides a film forming method and a film forming apparatus, in which a raw material is stably supplied and is not deteriorated while a high-quality metallic film with a good step coverage is practicably formed at a low cost. Also, the present invention provides a storage medium in which a program designed for executing the method is recorded.

In accordance with an aspect of the present invention, there is provided a film forming method including the steps of: producing a monovalent carboxylic acid metal salt gas by reacting a bivalent carboxylic acid metal salt with a carboxylic acid; supplying the monovalent carboxylic acid metal salt gas on a substrate; and providing energy to the substrate, and forming a metallic film by decomposing a carboxylic acid salt in the metal supplied to the substrate.

The bivalent carboxylic acid metal salt may be powdery, to which a carboxylic acid gas or a carboxylic acid liquid is supplied so as to provide the monovalent carboxylic acid metal salt gas. Also, the bivalent carboxylic acid metal salt may react with the carboxylic acid by heating.

The substrate may be disposed within a vacuum-maintained processing chamber, and the monovalent carboxylic acid metal salt gas produced by reacting the bivalent carboxylic acid metal salt with the carboxylic acid may be introduced into the processing chamber.

The monovalent carboxylic acid metal salt gas may be supplied on the substrate to accumulate the carboxylic acid salt on the substrate, and the carboxylic acid salt on the substrate may be decomposed by providing the energy to the substrate on which the monovalent carboxylic acid metal salt is accumulated. Also, the monovalent carboxylic acid metal salt gas may be supplied on the substrate while the energy is provided to the substrate.

Also, the metal may be selected from the group including copper, silver, cobalt, and nickel. The carboxylic acid may be selected from the group including formic acid, acetic acid, propionic acid, valeric acid, and butyric acid. Also, preferably, the bivalent carboxylic acid metal salt may be copper (II) formate, the carboxylic acid may be formic acid, and the monovalent carboxylic acid metal salt gas may be copper formate.

In accordance with another aspect of the present invention, there is provided a film forming method including the steps of: producing a monovalent carboxylic acid metal salt gas by reacting a bivalent carboxylic acid metal salt with a corresponding metal; supplying the monovalent carboxylic acid metal salt gas on a substrate; and providing energy to the substrate, and forming a metallic film by decomposing a carboxylic acid salt in the metal supplied to the substrate.

The monovalent carboxylic acid metal salt gas may be produced by heating the bivalent carboxylic acid metal salt coexisting with the corresponding metal.

The substrate may be disposed within a vacuum-maintained processing chamber, and the monovalent carboxylic acid metal salt gas produced by reacting the bivalent carboxylic acid metal salt with the corresponding metal may be introduced into the processing chamber.

The monovalent carboxylic acid metal salt gas may be supplied on the substrate to accumulate the carboxylic acid salt on the substrate, and the carboxylic acid salt on the substrate may be decomposed by providing the energy to the substrate on which the carboxylic acid salt is accumulated. Also, the monovalent carboxylic acid metal salt gas may be supplied on the substrate while the energy is provided to the substrate.

Also, the metal may be selected from the group including copper, silver, cobalt, and nickel. The carboxylic acid constituting the bivalent carboxylic acid metal salt may be selected from the group including formic acid, acetic acid, propionic acid, valeric acid, and butyric acid. Also, preferably, the bivalent carboxylic acid metal salt may be copper (II) formate, and the monovalent carboxylic acid metal salt gas may be copper formate.

In accordance with a further aspect of the present invention, there is provided a film forming apparatus including: a vacuum-maintained processing chamber on which a substrate is disposed; a substrate supporting member for supporting the substrate within the processing chamber; a gas producing mechanism for producing a monovalent carboxylic acid metal salt gas by reacting a bivalent carboxylic acid metal salt with a carboxylic acid; a gas supply mechanism for supplying the monovalent carboxylic acid metal salt gas on the substrate within the processing chamber; an energy supplying mechanism for supplying energy to the substrate supported by the substrate supporting member; and an exhaust mechanism for exhausting inside of the processing chamber, wherein the energy supplied by the energy supplying mechanism decomposes a carboxylic acid salt so as to form a metallic film on the substrate.

The gas producing mechanism may include: a carboxylic acid gas producing unit for producing a carboxylic acid gas; a reaction unit including the bivalent carboxylic acid metal salt disposed therein, which is for producing a monovalent carboxylic acid metal salt by reacting the carboxylic acid produced by the carboxylic acid gas producing unit, with the bivalent carboxylic acid metal salt; and a carboxylic acid gas supply pipe for supplying the monovalent carboxylic acid gas to the reaction unit, and the gas supply mechanism may include a carboxylic acid metal salt introducing inlet for introducing the produced monovalent carboxylic acid metal salt gas to the processing chamber.

Also, the reaction unit may include a reaction vessel which reservoirs powder of the bivalent carboxylic acid metal salt. The carboxylic acid metal salt introducing inlet may include a shower head which introduces the monovalent carboxylic acid metal salt gas in a shower form.

The gas supply mechanism may supply the monovalent carboxylic acid metal salt gas on the substrate to accumulate a monovalent carboxylic acid metal salt, and the energy supplying mechanism may decompose the carboxylic acid salt accumulated on the substrate by the energy. Also, the gas supply mechanism may supply the monovalent carboxylic acid metal salt gas on the substrate while the energy supplying mechanism supplies the energy to the substrate.

Also, the metal may be selected from the group including copper, silver, cobalt, and nickel. Also, the carboxylic acid used for the gas producing mechanism may be selected from the group including formic acid, acetic acid, propionic acid, valeric acid, and butyric acid.

In accordance with a still further aspect of the present invention, there is provided a film forming apparatus including: a vacuum-maintained processing chamber on which a substrate is disposed; a substrate supporting member for supporting the substrate within the processing chamber; a gas producing mechanism for producing a monovalent carboxylic acid metal salt gas by reacting a bivalent carboxylic acid metal salt with a corresponding metal; a gas supply mechanism for supplying the monovalent carboxylic acid metal salt gas on the substrate within the processing chamber; an energy supplying mechanism for supplying energy to the substrate supported by the substrate supporting member; and an exhaust mechanism for exhausting inside of the processing chamber, wherein the energy supplied by the energy supplying mechanism decomposes a carboxylic acid metal salt so as to form a metallic film on the substrate.

The gas producing mechanism may include a reaction unit where the bivalent carboxylic acid metal salt and the corresponding metal are disposed, and the bivalent carboxylic acid metal salt reacts with the metal by heating. The gas supply mechanism may include a carboxylic acid metal salt introducing inlet for introducing the produced monovalent carboxylic acid metal salt gas to the processing chamber.

Also, the carboxylic acid metal salt introducing inlet may include a shower head which introduces the monovalent carboxylic acid metal salt gas in a shower form.

The gas supply mechanism may supply the monovalent carboxylic acid metal salt gas on the substrate to accumulate a monovalent carboxylic acid metal salt, and the energy supplying mechanism may decompose the carboxylic acid salt accumulated on the substrate by the energy. Also, the gas supply mechanism may supply the monovalent carboxylic acid metal salt gas on the substrate while the energy supplying mechanism supplies the energy to the substrate.

Also, the metal may be selected from the group including copper, silver, cobalt, and nickel. Also, the carboxylic acid constituting the bivalent carboxylic acid metal salt may be selected from the group including formic acid, acetic acid, propionic acid, valeric acid, and butyric acid.

In the above mentioned apparatuses, the energy supplying mechanism may supply heat energy to the substrate.

In accordance with yet further aspect of the present invention, there is provided a storage medium which is operational in a computer and includes a program for controlling a film forming apparatus therein, wherein the program, when executed, controls the film forming apparatus in the computer in such a manner that a film forming method is performed, the film forming method including the steps of: producing a monovalent carboxylic acid metal salt gas by reacting a bivalent carboxylic acid metal salt with a carboxylic acid; supplying the monovalent carboxylic acid metal salt gas on a substrate; and providing energy to the substrate, and forming a metallic film by decomposing a carboxylic acid salt in the metal supplied to the substrate.

In accordance with yet further aspect of the present invention, there is provided a storage medium which is operational in a computer and includes a program for controlling a film forming apparatus therein, wherein the program, when executed, controls the film forming apparatus in the computer in such a manner that a film forming method is performed, the film forming method including the steps of: producing a monovalent carboxylic acid metal salt gas by reacting a bivalent carboxylic acid metal salt with a corresponding metal; supplying the monovalent carboxylic acid metal salt gas on a substrate; and providing energy to the substrate, and forming a metallic film by decomposing a carboxylic acid salt in the metal supplied to the substrate.

In the present invention, a bivalent carboxylic acid metal salt, for example, copper (II) formate, is used as a raw material, which is reduced by a carboxylic acid or a corresponding metal constituting the metal salt, (e.g., copper) so as to produce a monovalent carboxylic acid metal salt (e.g., copper formate). The monovalent carboxylic acid metal salt capable of forming a metallic film by low-energy thermal-decomposition is supplied to a substrate. Through the supply of energy to the monovalent carboxylic acid metal salt, a metallic film useful as a wiring layer, such as a copper film, can be obtained with a high step coverage. In this case, it is possible to achieve a good step coverage by accumulating a monovalent carboxylic acid metal salt on a substrate, and forming a metallic film by providing energy to the monovalent carboxylic acid metal salt on the substrate. An organic ligand to a metal atom in the bivalent carboxylic acid metal salt as the raw material is exhausted through thermal decomposition as a gas having no influence on the metallic film (copper film). Thus, since the film has little impurities, it is possible to obtain a very high quality film. Also, the bivalent carboxylic acid metal salt is much cheaper than a conventional Cu-CVD raw material organic compound. Thus, it is possible to reduce a cost for the raw material.

Also, since a monovalent carboxylic acid metal salt gas is produced by reacting a bivalent carboxylic acid metal salt with a carboxylic acid or a corresponding metal constituting the metal salt, it is possible to easily adjust the amount of the produced monovalent carboxylic acid metal salt. For this reason, it is possible to supply a raw material with a higher stability, compared to a conventional method in which copper formate gas is produced by heating copper (II) formate powder. Also, this method reduces the deterioration of the raw material.

DETAILED DESCRIPTION OF SEVERAL EMBODIMENTS

Figure 1:
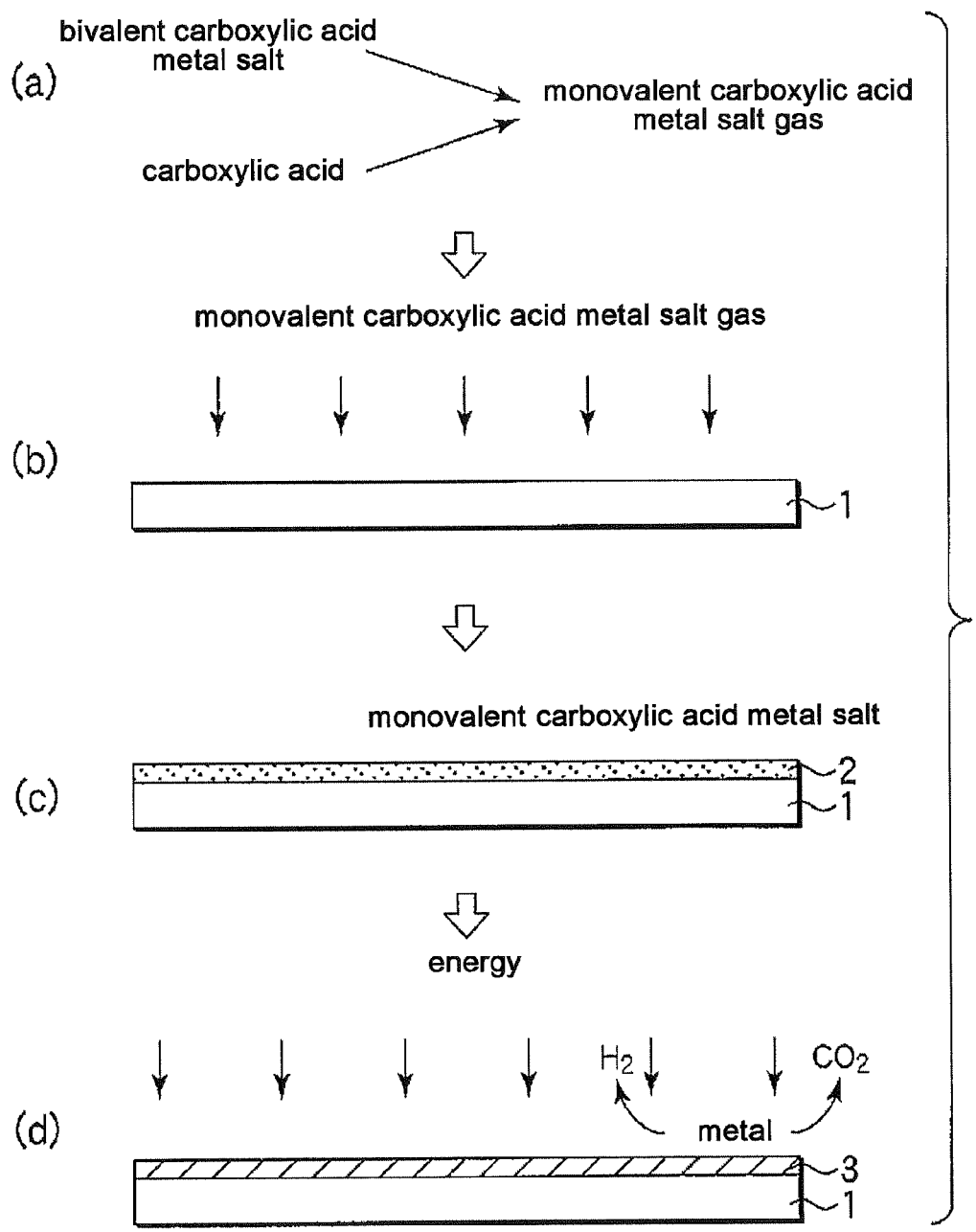
FIG. 1 is a mimetic diagram illustrating one example of the film forming method according to a first exemplary embodiment of the present invention.

Hereinafter, exemplary embodiments of the present invention will be described with reference to the accompanying drawings. First, a film forming method according to a first exemplary embodiment of the present invention will be described. FIG. 1 is a mimetic diagram illustrating a concept of the film forming method according to a first exemplary embodiment of the present invention.

As shown in FIG. 1a, a bivalent carboxylic acid metal salt including a metal of a metallic film to be manufactured is reacted with a carboxylic acid to produce a monovalent carboxylic acid metal salt gas. Specifically, for example, in general, a powder-type bivalent carboxylic acid metal salt is heated, and reacts with a supplied gas or liquid carboxylic acid. Then, the bivalent carboxylic acid metal salt is reduced to produce a monovalent carboxylic acid metal salt. The bivalent carboxylic acid metal salt generally has water of crystallization, and may be represented by $M(II)(R—COO)_2$ $(H_2O)_n$ provided that metal denotes M. Also, when the bivalent carboxylic acid metal salt is supplied with a carboxylic acid (R—COOH), and heated, it is possible to obtain a monovalent carboxylic acid metal salt represented by $M(I)$ (R—COO) through a reduction reaction.

In this process, by adjusting the amount of the supplied carboxylic acid, it is possible to control the amount of the produced monovalent carboxylic acid metal salt, and to stably supply a raw material with high controllability. Herein, before the bivalent carboxylic acid metal salt reacts with the carboxylic acid, the water of crystallization may be removed by heating, or the reaction may be performed without removing the water of crystallization.

It is preferred that carboxylic acid may have a high vapor pressure, and is appropriate for reaction through vaporization. The carboxylic acid may be preferably selected from the group including formic acid (HCOOH), acetic acid ($CH_3COOH$), propionic acid ($CH_3CH_2COOH$), valeric acid ($CH_3(CH_2)_3COOH$), and butyric acid ($CH_3(CH_2)2COOH$). Especially, formic acid having the highest vapor pressure is preferred. Also, the formic acid is preferable in that it is considered to have the smallest amount of intermediate decomposed product as a by-product because it contains only H except for a carboxylic group.

In like manner, a carboxylic acid constituting the bivalent carboxylic acid metal salt may be preferably selected from the group including formic acid, acetic acid, propionic acid, valeric acid, and butyric acid. The carboxylic acid to be included in the bivalent carboxylic acid metal salt, and the carboxylic acid to be supplied with the bivalent carboxylic acid metal salt may be same or different, but preferably are the same.

The metal constituting the bivalent carboxylic acid metal salt may be preferably copper (Cu). Besides, examples of the metal may include silver (Ag), nickel (Ni), and cobalt (Co). These metals may form a monovalent carboxylic acid metal salt that can be readily decomposed with a thermal treatment. Furthermore, copper (Cu) and silver (Ag) have a low resistance, and especially copper (Cu) has been spotlighted as a wiring material. Also, nickel (Ni), and cobalt (Co) are used as an electrode of a semiconductor device and transistor, a contact member for source/drain, and an electrode of a semiconductor memory and capacitor.

Then, as shown in FIG. 1b, the monovalent carboxylic acid metal salt gas produced as described above is supplied to a substrate. When monovalent carboxylic acid metal salt that can be readily decomposed with a thermal treatment is selected, the monovalent carboxylic acid metal salt can be thermally decomposed to a metal with ease by providing energy thereto. As described above, when a high vapor carboxylic acid is selected, the monovalent carboxylic acid metal salt can be easily decomposed with a thermal treatment, and thus can easily form a metal film. The monovalent carboxylic acid metal salt can be easily decomposed into a metal, and this characteristic is used to form a metallic film in the present invention.

Especially, in producing copper formate which is known to be an unstable material and easily decomposable into copper, copper (II) formate is used as the bivalent carboxylic acid metal salt, and formic acid is used as the carboxylic acid. This characteristic may be used in the present invention to easily form a copper film.

The copper formate is present as gas in vacuum, but is easily oxidized to be cuprous oxide in an atmospheric environment. Thus, the supply of the copper formate is carried out in vacuum. Herein, the temperature of copper formate is maintained at about 50~150° C. so that the copper formate can be maintained as gas. Also, the copper formate includes polymers as well as monomers. Also, in order to produce a large amount of copper formate gas, and prevent the produced copper formate from being decomposed in atmosphere, the partial pressure of formic acid gas need to be high to some extent. However, when the pressure is too high, the vaporization-supply of the formic acid is difficult. Accordingly, the partial pressure of formic acid gas in the production reaction of copper formate is preferably within a range of about 133~6650 Pa (1~50 Torr).

Then, as shown in FIG. 1c, the monovalent carboxylic acid metal salt is adsorbed on the substrate 1, and a predetermined amount of the monovalent carboxylic acid metal salt is accumulated, so as to form a monovalent carboxylic acid metal salt film 2 as a precursor of a metallic film. Herein, the temperature of substrate 1 is preferably within a range of about −30~50° C.

Then, as shown in FIG. 1d, energy is provided to the substrate formed with the monovalent carboxylic acid metal salt film 2, thereby carrying out the corresponding reaction. This decomposes the carboxylic acid salt and a metallic film 3 is formed.

Herein, heat energy is typically used as the energy. The heat energy can be provided by a resistance heater or a heating lamp used for a conventional film forming apparatus, and thus its application is relatively easy.

According to such a method, the monovalent carboxylic acid metal salt is adsorbed on the substrate surface as a raw material gas without thermal decomposition in a gas state, and then a metallic film is formed by energy. Thus, it is possible to improve the step coverage in the same manner as in conventional CVD. For this reason, the method can be applicable to a fine pattern in an ULSI wiring process. Also, it is possible to use a less expensive raw material as compared to a method that uses MOCVD, which makes it possible to form a film for a metal wiring at a low cost.

Figure 2:
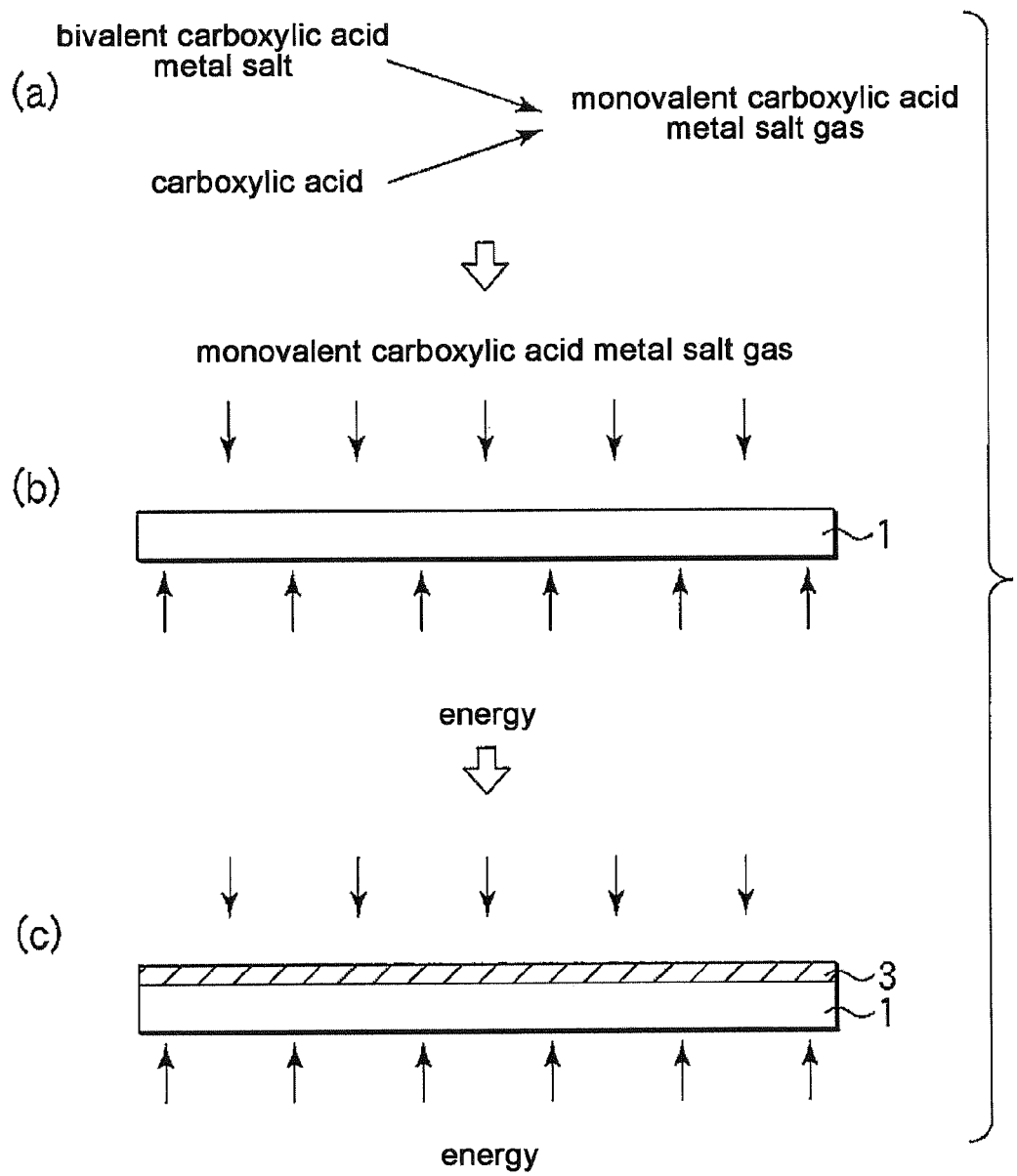
FIG. 2 is a mimetic diagram illustrating another example of the film forming method according to a first exemplary embodiment of the present invention.

Although it is preferable that the carboxylic acid salt is adsorbed on a substrate surface and is produced into a metallic film by providing energy in consideration of step coverage, as shown in FIG. 1, it is also possible to perform the method according to the present invention as shown in FIG. 2. In FIG. 2a, like in FIG. 1a, monovalent carboxylic acid metal salt is produced from bivalent carboxylic acid metal salt and carboxylic, and then, as shown in FIG. 2b, the produced monovalent carboxylic acid metal salt gas may be supplied to substrate 1 provided with energy such as heat energy. In this case, as shown in FIG. 2c, the carboxylic acid salt gas is decomposed as soon as it reaches substrate 1, thereby forming a metallic film 3. This process tends to show an inferior step coverage to the process shown in FIG. 1. However, this process is advantageous in that it is possible to form a metallic film within a relatively short time, compared to the case as shown in FIG. 1 in which the monovalent carboxylic acid metal salt is adsorbed on a substrate surface, and then energy is provided to form a metallic film.

Figure 3:
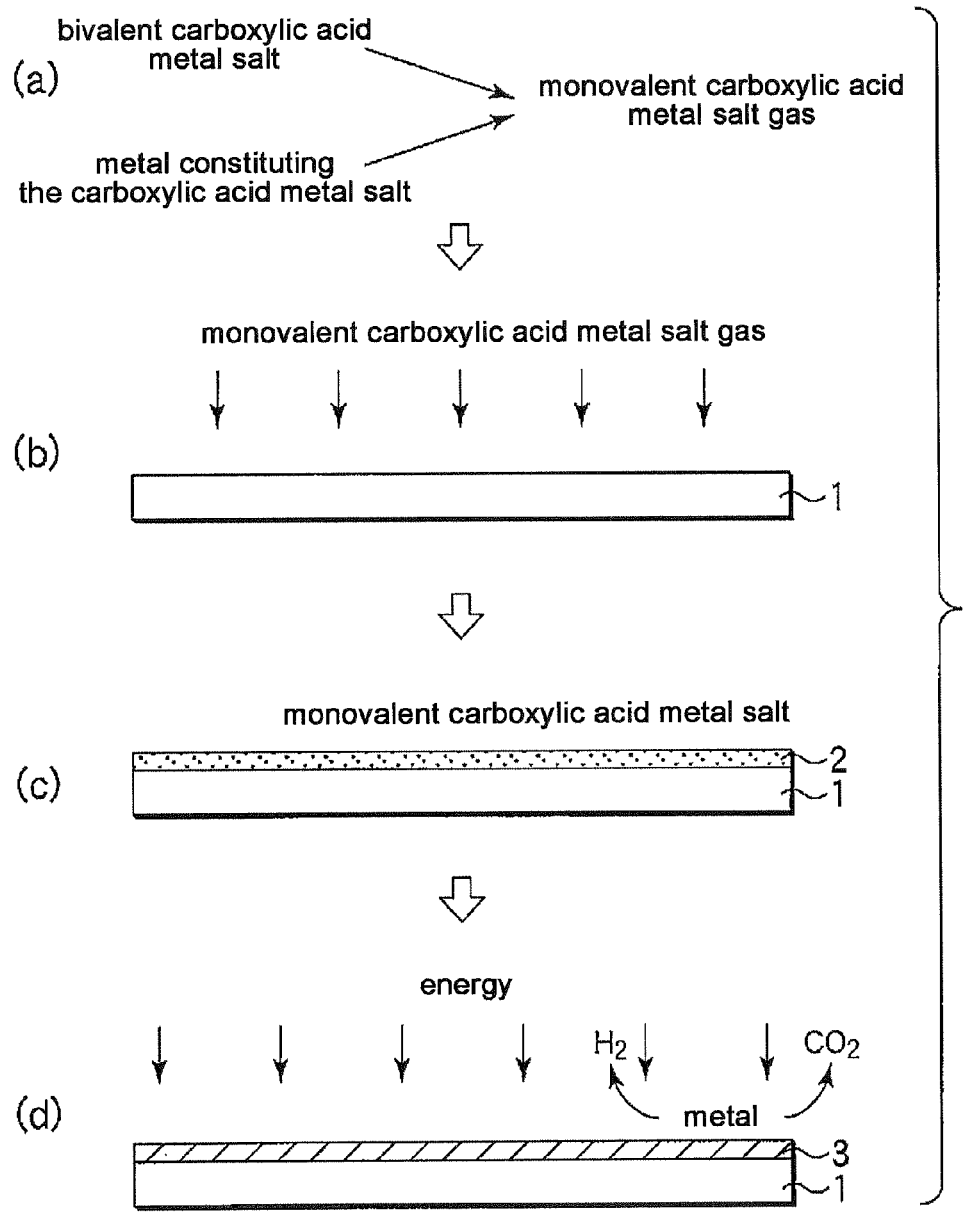
FIG. 3 is a mimetic diagram illustrating one example of the film forming method according to a second exemplary embodiment of the present invention.

Hereinafter, a second exemplary embodiment of the present invention will be described. FIG. 3 is a mimetic diagram illustrating a concept of the film forming method according to a second exemplary embodiment of the present invention.

As shown in FIG. 3a, a bivalent carboxylic acid metal salt including a metal of a metallic film to be manufactured is reacted with the metal constituting the metal salt so as to produce a monovalent carboxylic acid metal salt gas. Specifically, for example, a powder-type bivalent carboxylic acid metal salt generally coexists with the metal constituting the metal salt, and they react with each other by heating, which reduces the bivalent carboxylic acid metal salt, thereby forming a monovalent carboxylic acid metal salt. The bivalent carboxylic acid metal salt generally has water of crystallization, and may be represented by $M(II)R-COO)_2(H_2O)_n$ provided that metal denotes M. Also, when the bivalent carboxylic acid metal salt, coexisting with the metal M, is heated, it is possible to obtain a monovalent carboxylic acid metal salt represented by $M(I)(R-COO)$ through a reduction reaction.

In this second exemplary embodiment, by adjusting the ratio of bivalent carboxylic acid metal salt to metal and adjusting the supply amount of a carrier gas, it is possible to control the amount of the produced monovalent carboxylic acid metal salt, and to stably supply a raw material with high controllability. Herein, in the same manner as the first exemplary embodiment, before the bivalent carboxylic acid metal salt reacts with the metal, the water of crystallization may be removed by heating or the reaction can be performed without removing the water of crystallization.

Preferably, the carboxylic acid constituting the bivalent carboxylic acid metal salt may be selected from the group including formic acid, acetic acid, propionic acid, valeric acid, and butyric acid, in the same manner as the first exemplary embodiment.

As the metal constituting the bivalent carboxylic acid metal salt, copper (Cu) is preferred in the same manner as the first exemplary embodiment. Besides, examples of the metal may include silver (Ag), nickel (Ni), and cobalt (Co).

Then, as shown in FIG. 3b, the monovalent carboxylic acid metal salt gas produced as described above is supplied to substrate 1. When monovalent carboxylic acid metal salt that is readily decomposed with a thermal treatment is selected, it is possible to easily decompose the monovalent carboxylic acid metal salt to a metal by providing energy thereto. Especially, copper (II) is used as the bivalent carboxylic acid metal salt, and the copper (II) formate reacts with copper. Then, this produces copper formate which is known to be an unstable material and is easily decomposable into copper, in the same manner as the first exemplary embodiment. This characteristic may be used to form a copper film easily.

The copper formate is supplied in vacuum because it is easily oxidized in atmospheric environment to be cuprous oxide, as described in the first exemplary embodiment. Herein, the temperature of copper formate is maintained at about 50~150° C. so that the copper formate can be maintained as gas. Also, in order to produce a large amount of copper formate gas, and prevent the produced copper formate from being decomposed in atmosphere, the partial pressure of formic acid gas needs to be high to some extent. However, when the pressure is too high, the vaporization-supply of the formic acid is difficult. Accordingly, the partial pressure of formic acid gas in the production reaction of copper formate is preferably within a range of about 133~6650 Pa (1~50 Torr).

Then, as shown in FIG. 3c, the monovalent carboxylic acid metal salt is adsorbed on substrate 1, and a predetermined amount of the monovalent carboxylic acid metal salt is accumulated, so as to form a monovalent carboxylic acid metal salt film 2 as a precursor of a metallic film. Herein, the temperature of the substrate 1 is preferably within a range of about −30~50° C.

Then, as shown in FIG. 3d, energy is provided to the substrate formed with the monovalent carboxylic acid metal salt film 2, thereby carrying out the corresponding reaction. This decomposes the carboxylic acid salt, thereby forming a metallic film 3. Herein, heat energy is typically used as the energy in the same manner as the first exemplary embodiment. The heat energy can be provided by a resistance heater or a heating lamp used for a conventional film forming apparatus, and thus its application is relatively easy.

According to such a method, the monovalent carboxylic acid metal salt is adsorbed on the substrate surface as a raw material gas without thermal decomposition in atmosphere, and then a metallic film is formed by providing energy. Thus, the step coverage may be improved in the same manner as in conventional CVD. For this reason, the method can be applicable to a fine pattern in an ULSI wiring process. Also, it is possible to use a less expensive raw material than compared to a method that uses MOCVD, which makes it possible to form a film for a metal wiring at a low cost.

Figure 4:
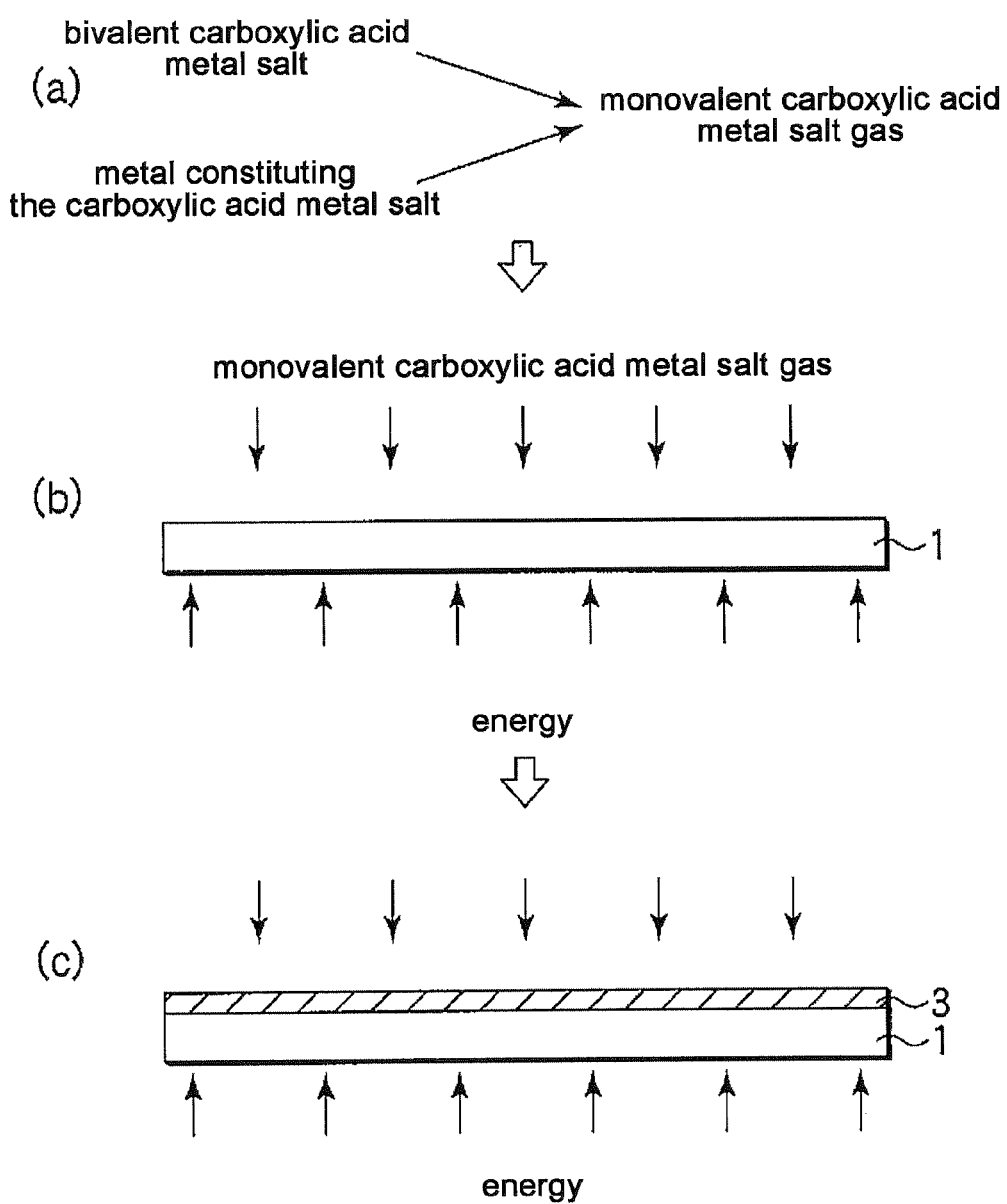
FIG. 4 is a mimetic diagram illustrating another example of the film forming method according to a second exemplary embodiment of the present invention.

Although it is preferable that the carboxylic acid salt is adsorbed on a substrate surface and is produced into a metallic film by energy in consideration of step coverage, as shown in FIG. 3, it is also possible to perform the method according to the present invention as shown in FIG. 4. In FIG. 4a, like in FIG. 3a, a monovalent carboxylic acid metal salt is produced from a bivalent carboxylic acid metal salt and a metal, and then as shown in FIG. 4b, the produced monovalent carboxylic acid metal salt gas is supplied to substrate 1 provided with energy such as heat energy. In this case, as shown in FIG. 4c, the carboxylic acid metal salt gas is decomposed as soon as it reaches on substrate 1, thereby forming metallic film 3. Although, this process shows inferior step coverage to the process shown in FIG. 3, but is advantageous in that a metallic film may be formed within a relatively short time, compared to the case as shown in FIG. 3 in which the monovalent carboxylic acid metal salt is adsorbed on a substrate surface, and then energy is provided to form a metallic film.

Hereinafter, the present invention will be described in more detail. First, a specific example of the first exemplary embodiment will be described where a monovalent carboxylic acid metal salt is formed from a bivalent carboxylic acid metal salt and a carboxylic acid. In other words, copper formate is formed by using copper (II) formate and formic acid, and copper formate is then supplied to a semiconductor wafer substrate. A copper film is then formed as a metallic film by energy.

Figure 5:
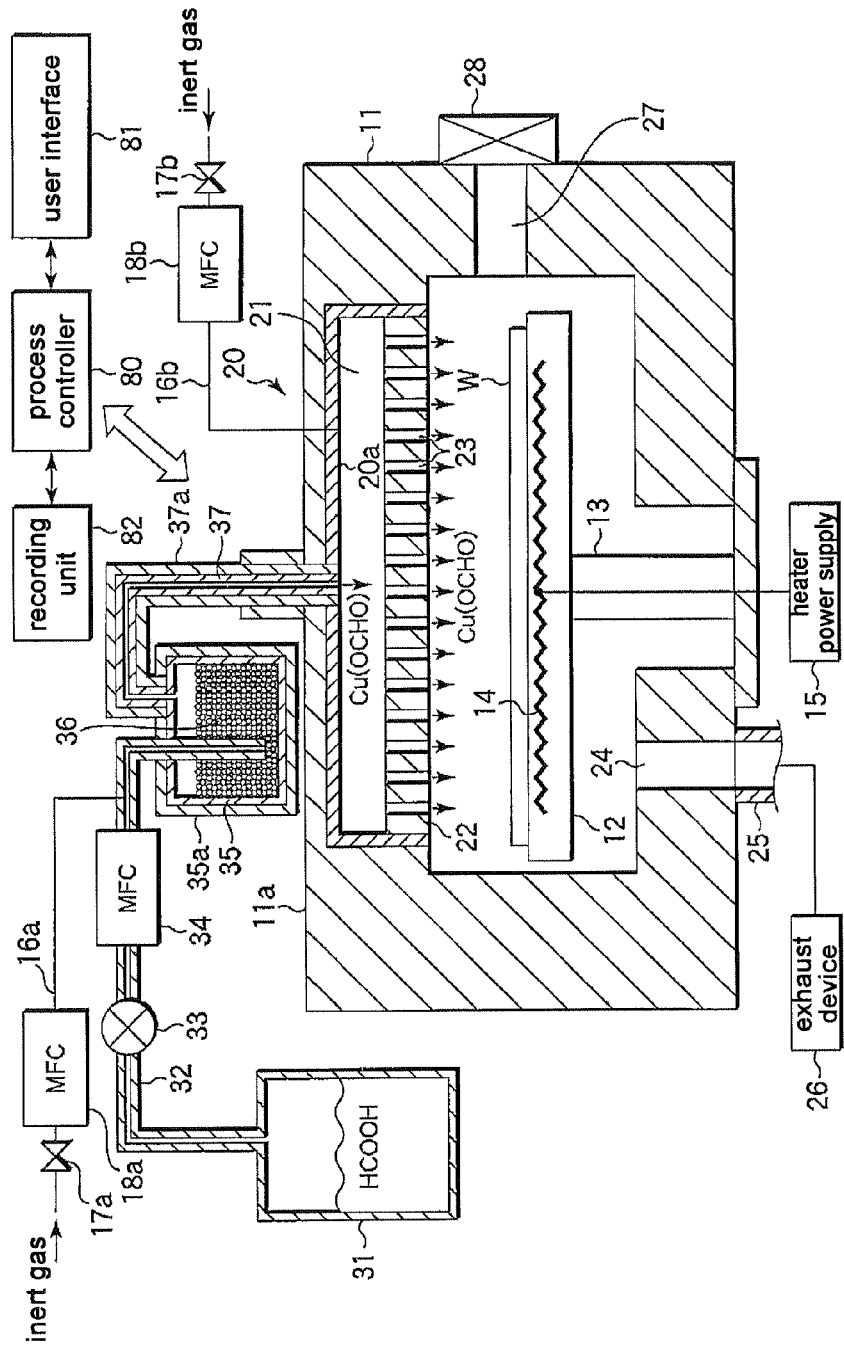
FIG. 5 is a cross-sectional view illustrating a schematic configuration of one example of a film forming apparatus which is designed for executing the method according to a first exemplary embodiment of the present invention.

FIG. 5 is a cross-sectional view illustrating a schematic configuration of one example of a film forming apparatus which is designed for executing the method according to the first exemplary embodiment of the present invention. The film forming apparatus shown in FIG. 5 has a chamber 11 which is formed into a cylindrical shape or a box shape by aluminum. Within chamber 11, a susceptor 12 is supported by a cylindrical supporting member 13 disposed in the center at bottom, which is for horizontally holding a semiconductor wafer W (hereinafter, referred to as a wafer) to-be-processed. A heater 14 is embedded in susceptor 12, and heater 14 is fed from a heater power supply 15 so as to heat the wafer W to-be-processed up to a predetermined temperature. Also, susceptor 12 may be made of ceramics, such as AlN.

On upper wall 11a of chamber 11, a shower head 20 is formed. Shower head 20 includes a flat-shaped gas diffusion space 21, and a shower plate 22. Gas diffusion space 21 is formed within an upper wall 11a of the chamber 11 and is horizontally extended. Shower plate 22 is formed below gas diffusion space 21 and has multiple gas discharge holes 23. Within the shower head 20, a heater 20a is provided.

An exhaust outlet 24 is formed at the bottom of the lateral wall of chamber 11, and exhaust outlet 24 is connected to a exhaust pipe 25. Exhaust pipe 25 is connected to an exhaust device 26 having a vacuum pump. By the operation of exhaust device 26, the inside pressure of chamber 11 is reduced to a predetermined degree of vacuum via exhaust pipe 25. A loading/unloading hole 27 for loading/unloading the wafer W, and a gate valve 28 for opening/closing the loading/unloading hole 27 are provided in the lateral wall of chamber 11.

Meanwhile, a formic acid reservoiring container 31 for reservoiring formic acid (HCOOH) is disposed at the outside of chamber 11, and a pipe 32 is extended from formic acid reservoiring container 31. A valve 33 and a mass flow controller (MFC) 34 for a flow control are provided in pipe 32. A reaction vessel 35 reservoiring copper (II) formate powder 36 is disposed in the neighborhood of chamber 11, and pipe 32 is inserted in reaction vessel 35. A heater 35a is provided around reaction vessel 35. Pipe 37 is connected to the top of reaction vessel 35, and pipe 37 extends from the top of chamber 11 up to a position facing gas diffusion space 21 within the shower head 20. A heater 37a is provided around pipe 37.

A gas line 16a for purging pipe 32 by an inert gas is connected to the downstream side of the mass flow controller (MFC) 34 of pipe 32. In gas line 16a, a valve 17a and a mass flow controller (MFC) 18a are provided from upstream side to downstream side. Also, within gas diffusion space 21 of the shower head 20, a gas line 16b for supplying a by-product purging and diluting gas is connected. In the gas line 16b, a valve 17b and a mass flow controller (MFC) 18b are provided from upstream side to downstream side.

The formic acid within formic acid reservoiring container 31 is gasified by an appropriated process, such as heating or bubbling, and the formic acid gas is introduced to the reaction vessel 35 via pipe 32. Before the supply of the formic acid gas, reaction vessel 35 is heated by heater 35a up to 50° C.~150° C., while a purge gas is supplied into reaction vessel 35 via gas line 16a so as to remove water of crystallization of copper (II) formate. Then, the inside of the reaction vessel 35 is maintained at 100° C.~250° C. by heater 35a, while the formic acid gas is supplied so as to react the copper (II) formate powder 36 with the formic acid gas, thereby producing copper formate gas represented by Formula (3) below:

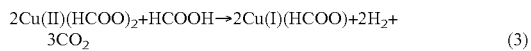

$$2Cu(II)(HCOO)_2 + HCOOH \rightarrow 2Cu(I)(HCOO) + 2H_2 + 3CO_2 \qquad (3)$$

Also, the formic acid gas may be supplied to reaction vessel 35 without removal of the water of crystallization of copper (II) formate. Also, in the supply of formic acid, a formic acid liquid may be gasified by being supplied to a vaporizer. Otherwise, a formic acid liquid as it is may be supplied to the reaction vessel so as to carry out the reaction.

The respective components of the film forming apparatus are connected to a process controller 80 provided with a micro processor (computer), and controlled by process controller 80. Also, a keyboard or a user interface 81 is connected to the process controller 80. An operator may input a command for managing the film forming apparatus by the keyboard. The user interface 81 includes a display for visually displaying the operation state of the film forming apparatus. Also, process controller 80 is connected to a storage unit 82 that stores a control program for controlling various processes performed in the film forming apparatus, and a recipe program for performing processes in the respective components of the film forming apparatus according to processing conditions. The recipe program may be recorded in a storage medium. The storage medium may be a fixed-type medium, such as a hard disk, or a portable-type medium, such as CD ROM, DVD, etc. Also, the recipe program may be appropriately transmitted from another device, for example, via a dedicated line. Also, any recipe program may be retrieved from storage unit 82 as required in accordance with the instruction from user interface 81, and executed in the process controller 80, thereby performing a required process in the film forming apparatus under the control of the process controller 80.

Hereinafter, the film forming method performed by the film forming apparatus configured as described above will be described. First, gate valve 28 is opened, and the wafer W is loaded into chamber 11 via loading/unloading hole 27, and the wafer W is placed on susceptor 12. Exhaust device 26 exhausts the inside of chamber 11 by exhaust outlet 24 and exhaust pipe 25, thereby reducing the pressure of the inside of the chamber to a predetermined level.

In this state, the water of crystallization of copper (II) formate powder 36 may be removed as required. Then, by opening valve 33, the formic acid gas whose flow rate has been controlled up to a predetermined level by mass flow controller (MFC) 34 is introduced to reaction vessel 35 via pipe 32. Herein, reaction vessel 35 is heated by heater 35a up to about 50° C.~150° C., and as a result, copper(II) formate powder 36 reacts with the formic acid gas within the reaction vessel 35 according to Formula (3) so as to produce copper formate gas. The copper formate gas reaches gas diffusion space 21 of the shower head 20 via pipe 37, and is discharged toward the wafer W via multiple gas discharge holes 23 formed in shower plate 22. Herein, the copper formate gas is maintained at about 50° C.~150° C. by heaters 37a, 20a provided respectively in the circumference of pipe 37, and within shower head 20 to be supplied to the wafer W in a gas state.

The copper formate gas is adsorbed on the wafer W while the wafer W is maintained at room temperature to about 50° C., thereby forming a copper formate film as a precursor. Herein, the thickness of the copper formate film may be controlled by the supply time of the copper formate gas and the temperature of the wafer.

The film forming process for the precursor which is the copper formate film is performed for a predetermined of time, and the supply of the copper formate gas is stopped at the time point when the thickness of the copper formate film as the precursor reaches a predetermined level. And then the wafer W is heated up to 100° C.~250° C. by heater 14. The heat energy by the heater decomposes the copper formate according to the reaction scheme represented by Formula (2), thereby forming a copper film having a predetermined thickness.

Then, the output operation of heater 14 is stopped, and the gas lines are converted into purge gas lines 16a and 16b so as to purge by-product gas or surplus formic acid gas by an inert gas such as $N_2$ or Ar. Next, the pressure within chamber 11 is adjusted according to the external pressure, and the wafer W is unloaded by opening gate valve 28.

Using the apparatus as configured above, it is possible to form a high-quality copper film with a good step coverage at a low cost. Also, it is possible to form a copper film by a relatively simple method in which the copper formate gas is produced by introducing the formic acid gas into reaction vessel 35, the produced copper formate gas is introduced into the chamber where the wafer W adsorbs the copper formate, and the copper film is formed by heating.

In the apparatus configured as described above, after placing the wafer W on susceptor 12 and adjusting the inside pressure of chamber 11 to a predetermined pressure, the copper formate gas produced from the inside of reaction vessel 35 may be discharged toward the wafer W by shower head 20 while the wafer W is heated up to 100° C.~250° C. by heater 14. Through this process, the copper formate may be decomposed by the reaction scheme represented by Formula (2) before being accumulated on the wafer W, thereby forming a copper film with a predetermined thickness on the wafer W. For this reason, according to the apparatus as configured as described above, it is possible to reduce the time for forming a copper film.

Figure 6:
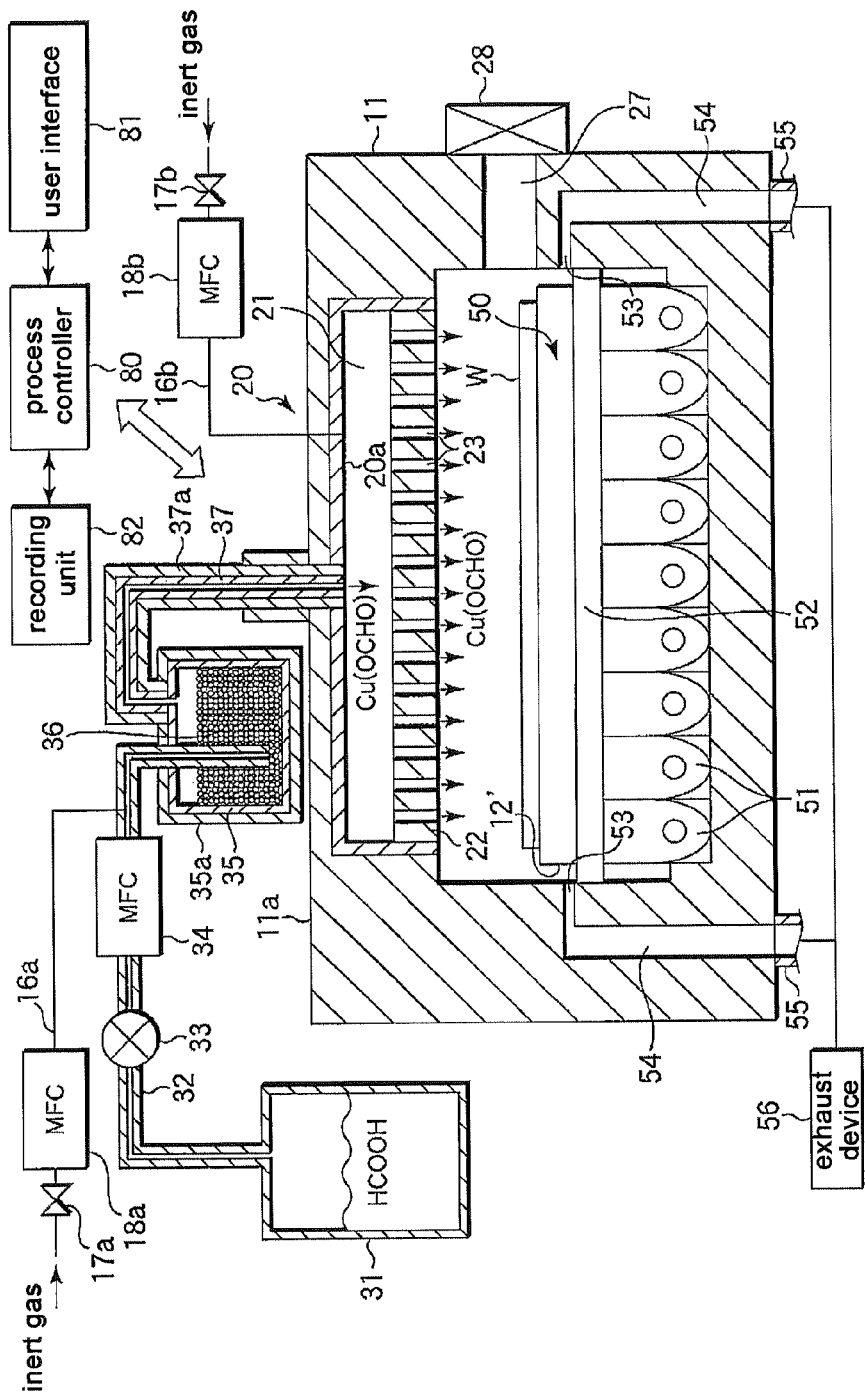
FIG. 6 is a cross-sectional view illustrating a schematic configuration of another example of a film forming apparatus which is designed for executing the method according to a first exemplary embodiment of the present invention.

Hereinafter, another example of a film forming apparatus which is designed for executing the method according to the first exemplary embodiment of the present invention will be described. FIG. 6 is a cross-sectional view illustrating a schematic configuration of another example of a film forming apparatus which is designed for executing the method according to the first exemplary embodiment of the present invention. This film forming apparatus basically has similar configuration to that of the apparatus shown in FIG. 5, except for a means for heating a wafer on a susceptor, and an exhaust path. Thus, the same elements are denoted by the same numerals and their descriptions are omitted.

In the apparatus shown in FIG. 6, instead of susceptor 12, another susceptor 12' not provided with a heater is provided, and a lamp heating unit 50 is provided beneath susceptor 12'. Lamp heating unit 50 includes a plurality of lamp heaters 51 arranged therein, and a transmission window 52 is disposed on lamp heaters 51. Lamp heaters 51 include UV lamps, and the transmission window 52 is made of a heating-wire transmissive material such as quartz. Susceptor 12' is disposed on the transmission window 52.

Also, an exhaust outlet 53 is opened at a position of the lateral wall of chamber 11, corresponding to the height of susceptor 12'. From exhaust outlet 53, an exhaust path 54 is formed extending horizontally from the lateral wall of chamber 11 and further extending downwardly at halfway point. Exhaust path 54 is opened at the bottom surface of chamber 11. Also, exhaust path 54 is connected to an exhaust pipe 55 which is connected to an exhaust device 56 having a vacuum pump. By the operation of exhaust device 56, the inside of pressure of chamber 11 is reduced to a predetermined degree of vacuum via exhaust path 54 and exhaust pipe 55.

The film forming method in the apparatus shown in FIG. 6 is carried out in the similar way to that in the apparatus shown in FIG. 5. First, the wafer W is loaded onto susceptor 12', and the inside of chamber 11 is maintained at a predetermined pressure. Then, the formic acid whose flow rate has been controlled up to a predetermined level by the mass flow controller (MFC) 34 is introduced to reaction vessel 35 via pipe 32 by opening valve 33. Herein, the inside of reaction vessel 35 has been heated by heater 35a up to about 50° C.~150° C. and the copper(II) formate powder 36 reacts with the formic acid gas within reaction vessel 35, so as to produce copper formate gas. The copper formate gas reaches shower head 20 via pipe 37, and is discharged toward the wafer W via discharge holes 23. Herein, the copper formate gas is maintained at about 50° C.~150° C. by heaters 37a, 20a provided respectively in the circumference of pipe 37, and within shower head 20, to be supplied to the wafer W in a gas state. The copper formate gas discharged from shower head 20 is adsorbed on the wafer W, thereby forming a solid copper formate film as a precursor. Then, the wafer formed with the copper formate film with a required thickness is heated up to 100° C.~250° C. by a lamp heater. The heat energy by the heater decomposes the copper formate according to the reaction scheme represented by Formula (2), thereby forming a copper film with a predetermined thickness.

In the apparatus shown in FIG. 6, since the wafer W is heated by lamp heating unit 50, the rising speed of temperature is fast after the formation of the copper formate film. Accordingly, it is possible to quickly and conveniently carry out the reaction scheme represented by Formula (2), and to form a copper film with high throughput.

In the apparatus shown in FIG. 6, after placing the wafer W on the susceptor 12' and adjusting the inside of chamber 11 to a predetermined pressure, the copper formate gas produced from the inside of reaction vessel 35 may be discharged toward the wafer W by shower head 20 while the wafer W is heated up to 100° C.~250° C. by lamp heating unit 50. Through this process, the copper formate may be decomposed by the reaction scheme represented by Formula (2) before being accumulated on the wafer W, thereby forming a copper film with a predetermined thickness on the wafer W. For this reason, it is possible to reduce the processing time for forming a copper film.

Figure 7:
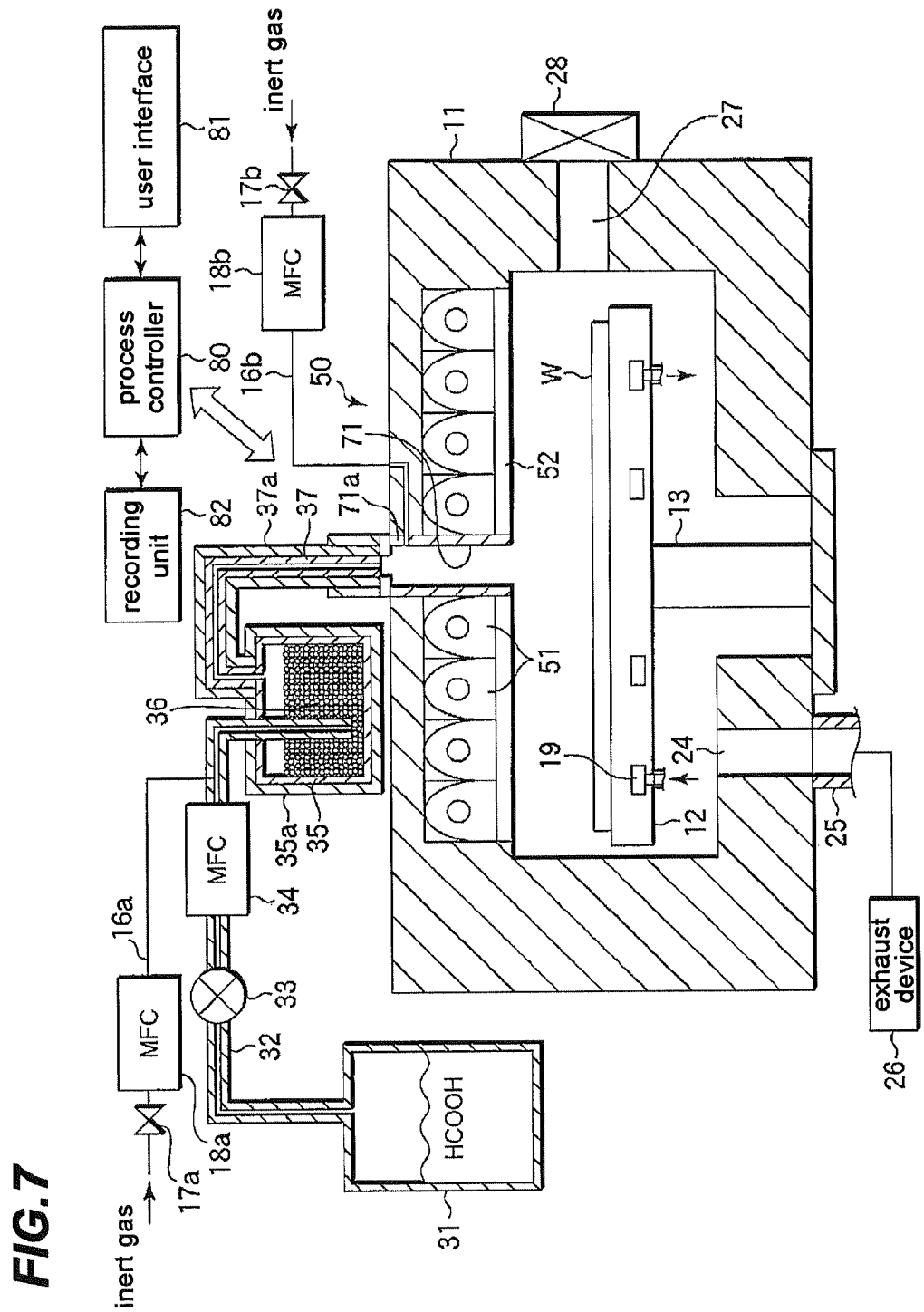
FIG. 7 is a cross-sectional view illustrating a schematic configuration of a further example of a film forming apparatus which is designed for executing the method according to a first exemplary embodiment of the present invention.

Hereinafter, a further example of a film forming apparatus which is designed for executing the method according to the first exemplary embodiment of the present invention will be described. FIG. 7 is a cross-sectional view illustrating a schematic configuration of a further example of a film forming apparatus which is designed for executing the method according to the first exemplary embodiment of the present invention.

Unlike the film forming apparatus shown in FIG. 5, the film forming apparatus shown in FIG. 7 includes a lamp heating unit 50 in the upper portion of chamber 11, instead of a heater in the susceptor 12. The film forming apparatus further includes a gas introducing inlet 71 formed in the upper wall of chamber 11, instead of a shower head, and a heater 71a within gas introducing inlet 71. Other elements are basically similar to those of the apparatus shown in FIG. 5, and thus the same elements are denoted by the same numerals and their descriptions are omitted.

In the film forming apparatus shown in FIG. 7, the wafer W is loaded into chamber 11 and is placed on susceptor 12, and the inside of chamber 11 is maintained at a predetermined pressure. Then, the formic acid gas whose flow rate has been controlled up to a predetermined level by mass flow controller (MFC) 34 is introduced to reaction vessel 35 via pipe 32 by opening valve 33. Herein, the inside of reaction vessel 35 has been heated by the heater 35a up to about 50° C.~150° C. The copper (II) formate powder 36 reacts with the formic acid gas within the reaction vessel 35, according to the reaction scheme represented by Formula (3) so as to produce the copper formate gas. The copper formate gas is then introduced into chamber 11 via pipe 37 and gas introducing inlet 71. Herein, the copper formate gas is maintained at about 50°

C.~150° C. by heater 37a of pipe 37, and by heater 71a of gas introducing inlet 71 to be supplied to the wafer W in a gas state. The copper formate gas is adsorbed on the wafer W while the wafer W is maintained at about −30° C.~50° C. Accordingly, through the supply of the copper formate gas for a predetermined time, a solid copper formate film is formed with a predetermined thickness.

Then, the wafer W is heated up by lamp heating unit 50. Herein, the heat energy decomposes the copper formate according to the reaction scheme represented by Formula (2), thereby forming a copper film with a predetermined thickness.

In the above described configuration, the uniformity of the gas supply may be slightly reduced due to the absence of the shower head. However, since the copper formate is decomposed by lamp-heating from the upper side, it is possible to more quickly heat the wafer W compared to the apparatus having the lamp heating unit below susceptor 12, shown in FIG. 6. This may further improve the throughput. Susceptor 12 does not include a heating means therein, and thus can have a cooling mechanism.

Based on the fact that the amount of the copper formate gas adsorbed on the surface of the wafer W increases at a lower temperature, this method in the apparatus shown in FIG. 7 may be more advantageous than that in the apparatuses shown in FIGS. 5 and 6.

In the apparatus shown in FIG. 7, after placing the wafer W on susceptor 12, and adjusting the inside of chamber 11 to a predetermined pressure, the copper formate gas produced from the inside of reaction vessel 35 may be supplied toward the wafer W from gas introducing inlet 71 while the wafer W is heated up to 100° C.~250° C. by lamp heating unit 50. Through this process, the copper formate may be decomposed by the reaction scheme represented by Formula (2) before being accumulated on the wafer W, thereby forming a copper film with a predetermined thickness on the wafer W. For this reason, it is possible to reduce the processing time for forming a copper film.

Hereinafter, a specific example of a second exemplary embodiment will be described. Herein, a monovalent carboxylic acid metal salt is formed from a bivalent carboxylic acid metal salt and a metal. In other words, copper formate is formed by using copper (II) formate and copper, and the copper formate is supplied to a semiconductor wafer as a substrate. A copper film is then formed by energy as a metallic film .

Figure 8:
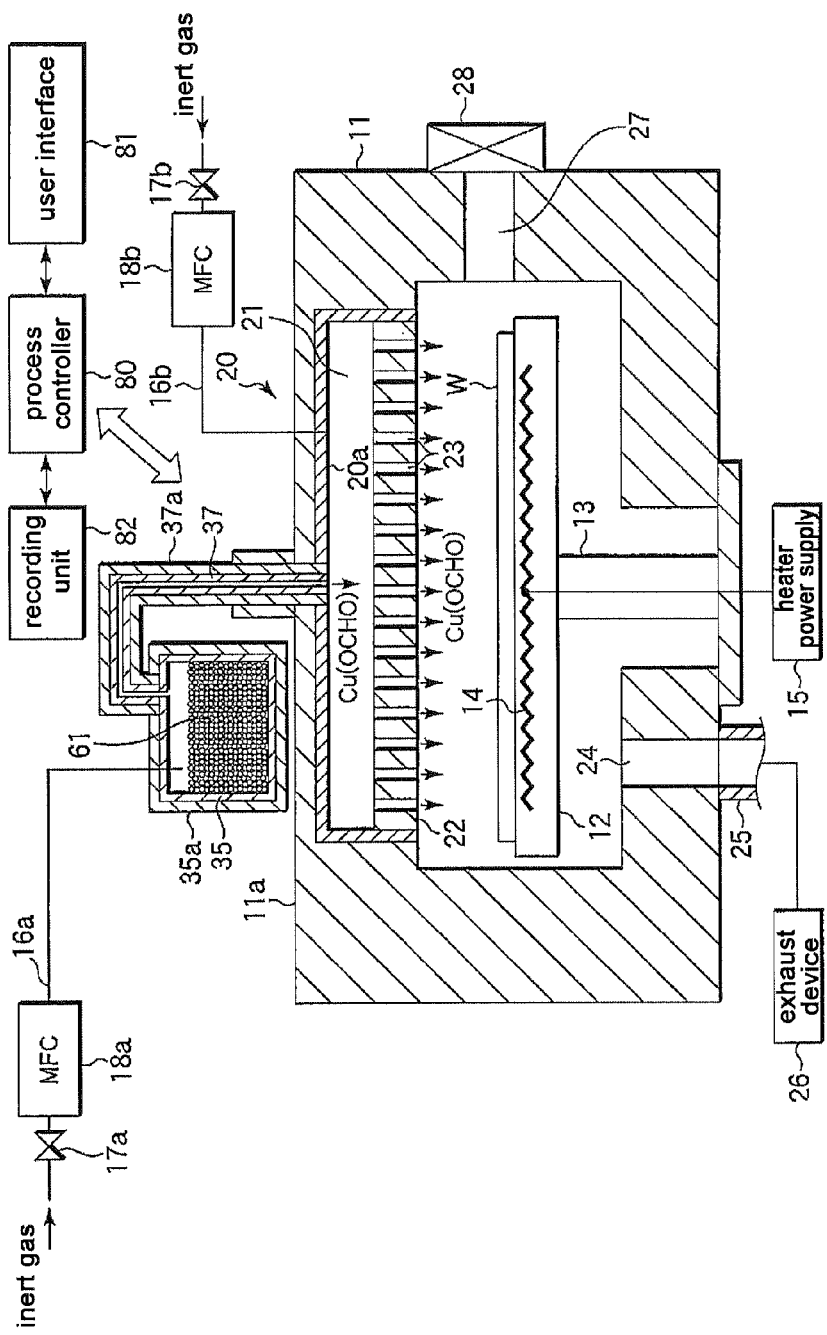
FIG. 8 is a cross-sectional view illustrating a schematic configuration of one example of a film forming apparatus which is designed for executing the method according to a second exemplary embodiment of the present invention.

FIG. 8 is a cross-sectional view illustrating a schematic configuration of one example of a film forming apparatus which is designed for executing the method according to the second exemplary embodiment of the present invention. The film forming apparatus basically has similar configuration to that of the apparatus shown in FIG. 5, except that a raw material charged within the reaction vessel 35 is different from that in FIG. 5, and there is no formic acid supply mechanism. Accordingly, the same elements are denoted by the same numerals and their descriptions are omitted.

In the apparatus shown in FIG. 8, a mixed powder 61 of copper (II) formate powder and copper powder is stored within reaction vessel 35. First, reaction vessel 35 is heated up to about 50° C.~150° C. by heater 35a, while a purge gas is supplied into reaction vessel 35 through gas line 16a so as to remove the water of crystallization of copper(II) formate powder. Then, heater 35a maintains the inside temperature of reaction vessel 35 at about 150° C.~250° C., and the copper (II) formate powder reacts with the copper powder inside reaction vessel 35 so as to produce copper formate gas according to the reaction scheme represented by Formula (4) below:

$$Cu(II)(HCOO)_2 + Cu \rightarrow 2Cu(I)(HCOO) \qquad (4)$$

Also, the water of crystallization of copper (II) formate may not be removed while the temperature is increased up to a predetermined level for the reaction.

The film forming method in the apparatus shown in FIG. 8 is carried out in the similar way to that in the apparatus shown in FIG. 5. First, the wafer W is loaded onto susceptor 12, and the inside of chamber 11 is maintained at a predetermined pressure. In this state, the water of crystallization of copper (II) formate powder may be removed as required. Subsequently, the inside of reaction vessel 35 is heated by heater 35a up to about 150° C.~250° C. and the copper(II) formate powder reacts with the copper powder according to Formula (4) so as to produce copper formate gas. The copper formate gas reaches gas diffusion space 21 of shower head 20 via pipe 37, and is discharged toward the wafer W via the multiple gas discharge holes 23 formed in shower plate 22. Herein, the copper formate gas is maintained at about 50° C.~150° C. by heaters 37a and heater 20a provided respectively in the circumference of pipe 37 and within shower head 20, to be supplied to the wafer W in a gas state.

The copper formate gas is adsorbed on the wafer W while the wafer W is maintained at room temperature to about 50° C., thereby forming a copper formate film as a precursor. Herein, the thickness of the copper formate film may be controlled by the supply time of the copper formate gas and the temperature of the wafer.

After performing the process for forming the copper formate film for a predetermined time, the supply of the copper formate gas is terminated at a point when the thickness of the copper formate film as the precursor meets with a predetermined level, and the wafer W is then heated up to 100° C.~250° C. by heater 14. The heat energy by the heater decomposes the copper formate according to the reaction scheme represented by Formula (2), thereby forming a copper film having a predetermined thickness.

Then, the output operation of heater 14 is terminated, and an inert gas such as $N_2$ or Ar is supplied via the purge gas line 16b as well as the purge gas line 16a so as to purge by-product gas. Next, the pressure of chamber 11 is adjusted according to the external pressure, and the wafer W is unloaded by opening gate valve 28.

Through the apparatus as configured above, it is possible to form a high-quality copper film with a good step coverage at a low cost. Also, it is possible to form a copper film by a relatively simple method in which the copper formate gas is produced by the reaction of copper(II) formate with within reaction vessel 35, and the produced copper formate gas is introduced into the chamber to adsorb the copper formate on the wafer W. The copper film is then formed by heating.

In the apparatus configured as described above, after placing the wafer W on susceptor 12, and adjusting the inside pressure of chamber 11 to a predetermined value, the copper formate gas produced from the inside of reaction vessel 35 may be discharged toward the wafer W by shower head 20 while the wafer W is heated up to 100° C.~250° C. by heater 14. Through this process, the copper formate may be decomposed by the reaction scheme represented by Formula (2) before being accumulated on the wafer W, thereby forming a copper film with a predetermined thickness on the wafer W. For this reason, according to the apparatus as configured as described above, it is possible to reduce the time for forming the copper film.

Also, in the secondary exemplary embodiment, the configuration of the apparatus shown in FIG. 6 or 7 may be applied to the apparatus shown in FIG. 8.

Although both of a cuprous oxide adsorbing process and a copper film forming process by heating are performed within one chamber in the apparatuses shown in FIGS. 5 through 8, these processes may be performed in different chambers considering the throughput and the degree of freedom in processes.

Figure 9:
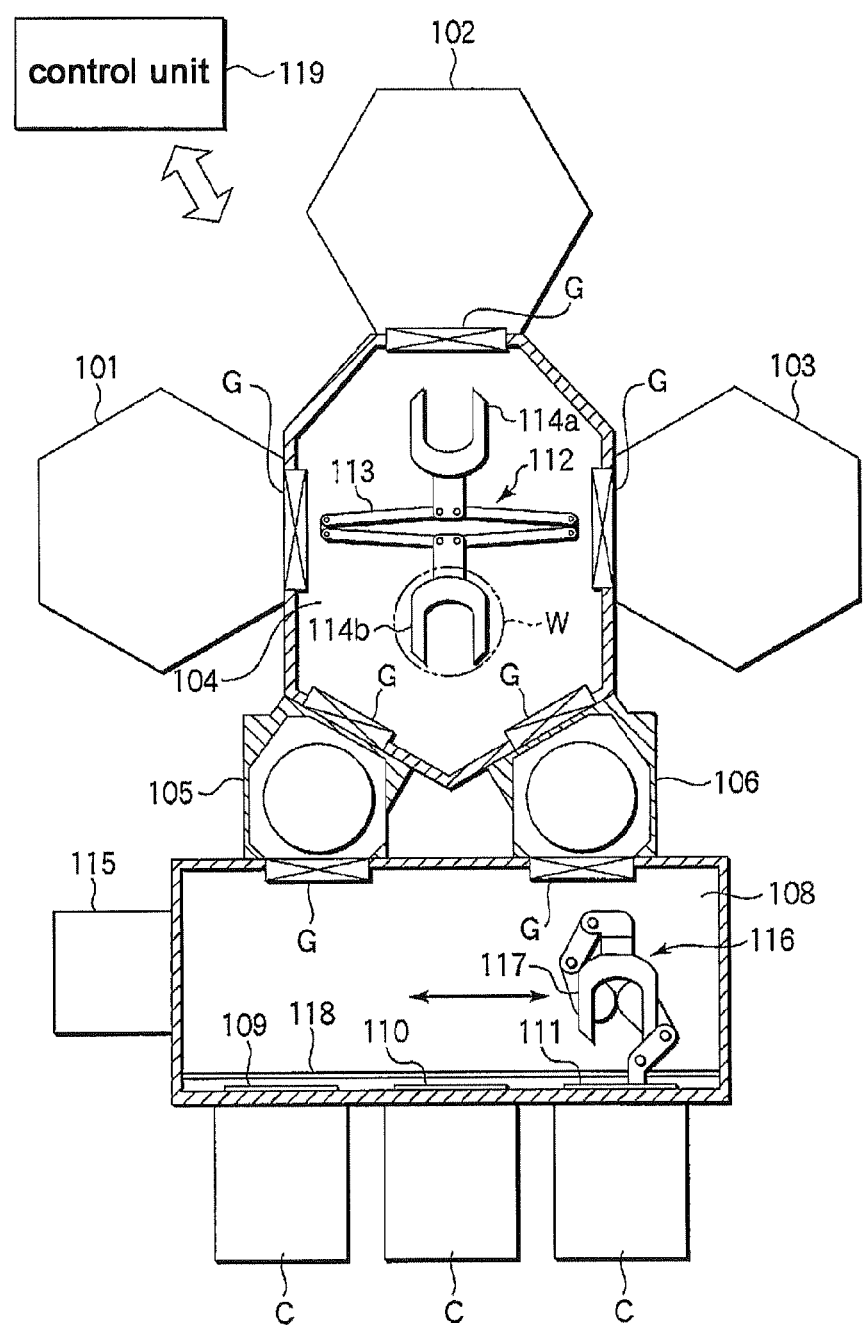
FIG. 9 is a plan view illustrating the schematic configuration of a multi chamber system for executing the method according to the present invention.

FIG. 9 is a plan view illustrating the schematic configuration of a cluster-type multi chamber system having chambers for executing these processes. The system includes, an adsorbing unit 101 where the copper formate is adsorbed on the wafer W, an annealing unit 102 for annealing the wafer W to decompose the copper formate adsorbed on the wafer W by heat energy thereby forming a copper film, and a cooling unit 103 for cooling the annealed wafer W. Each of the three units is provided at one of corresponding three sides of a heptagonal wafer carrying chamber 104. Also, load/lock chambers 105, 106 are provided on the other two sides of wafer carrying chamber 104, respectively. On these load/lock chambers 105 and 106, a wafer loading/unloading chamber 108 is provided on the opposite side of wafer carrying chamber 104. On wafer loading/unloading chamber 108, there are provided ports 109, 110, 111 that can receive three carriers C for receiving the wafer W on the opposite side of load/lock chambers 105 and 106.

As shown in FIG. 9, each of adsorbing unit 101, annealing unit 102, cooling unit 103, and load/lock chambers 105 and 106 is connected to a respective side of wafer carrying chamber 104 via gate valves G. Each of the units is communicated with or blocked from wafer carrying chamber 104 by opening or closing the corresponding gate valves G. Also, load/lock chambers 105,106 are connected to wafer loading/unloading chamber 108 via gate valves G. Load/lock chambers 105, 106 are communicated with or blocked from wafer loading/unloading chamber 108 by opening or closing the corresponding gate valves G.

A wafer carrying device 112 is provided within wafer carrying chamber 104 for loading/unloading the wafer W to/from adsorbing unit 101, annealing unit 102, cooling unit 103, and load/lock chambers 105 and 106. Wafer carrying device 112 is disposed at about the center of wafer carrying chamber 104, and has two blades 114a and 114b which support the wafer W on the leading end of a rotatable/expandable rotating/expanding unit 113. These two blades 114a and 114b are attached to rotating/expanding unit 113 in such a manner that the two blades are directed toward the opposite directions. The inside of wafer carrying chamber 104 is maintained with a predetermined degree of vacuum.

In wafer loading/unloading chamber 108, each of three ports 109, 110, and 111 configured to attach carriers C, is provided with a shutter (not shown). A wafer W receiving carrier or an empty carrier C may be attached directly to the ports. Also, an alignment chamber 108 is provided at the lateral side of wafer loading/unloading chamber 108, in which an alignment operation of the wafer W is carried out.

A wafer carrying device 116 is provided within wafer loading/unloading chamber 108 for loading/unloading the wafer W to/from the carriers C and load/lock chambers 105, 106. Wafer carrying device 116 has a multi joint arm structure, and is configured to move on a rail 118 in the arrangement direction of the carriers C to carry the wafer W disposed on a hand 117 of the leading end thereof. The control of the entire system, including the operation of the wafer carrying devices 112, 116, is performed by a control unit 119 which has functions of process controller 80, user interface 81, and storage unit 82.

Adsorbing unit 101 may utilize basically the same apparatus as shown in FIGS. 5 through 8 except for the heating means.

Figure 10:
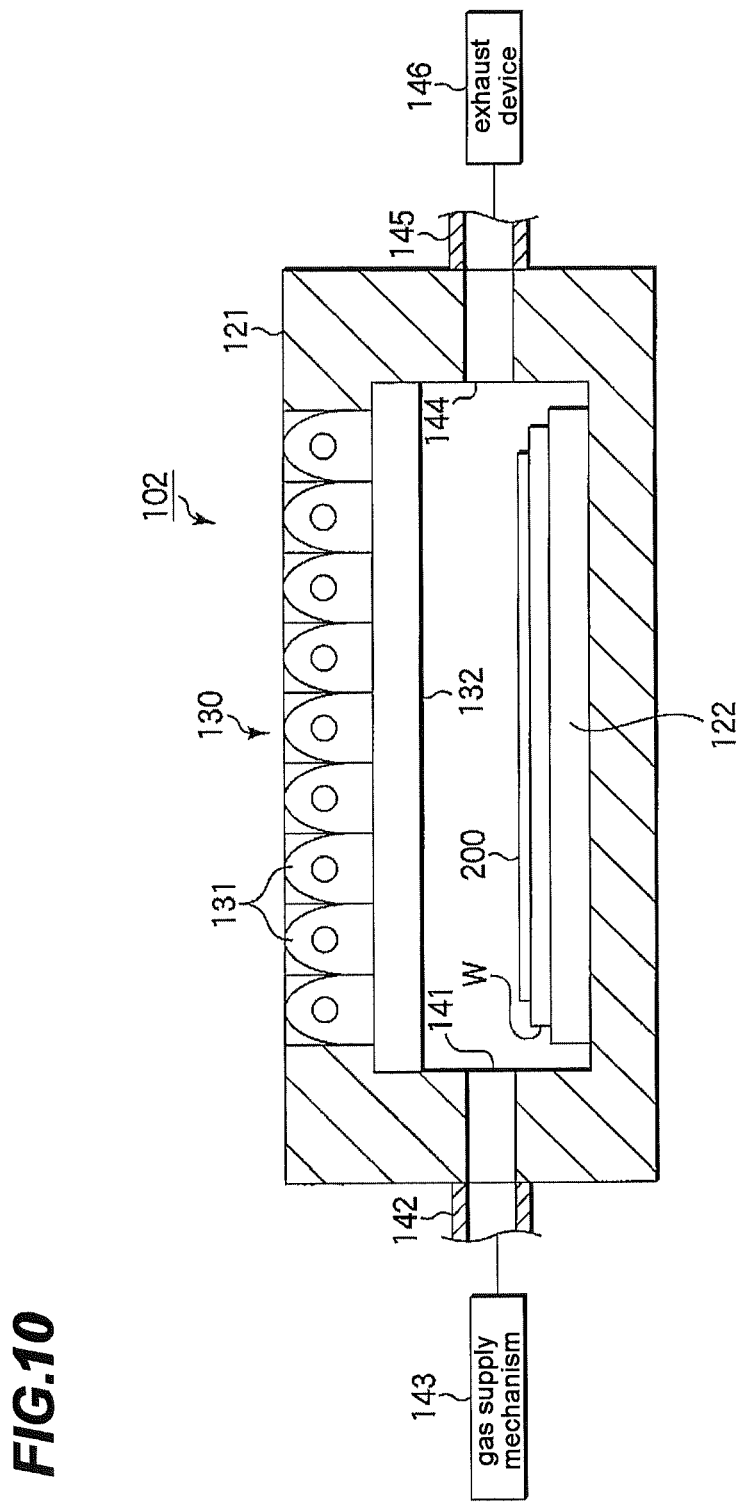
FIG. 10 is a cross-sectional view illustrating an annealing unit used for the system shown in FIG. 9.

While any structure that can heat the wafer W may be used as an annealing unit, annealing unit 102 as shown in FIG. 10 may be appropriately used. Annealing unit 102 has a flat-type chamber 121, and a susceptor 122 disposed at the bottom of chamber 121 on which the wafer W formed with copper formate film 200 may be placed.

A lamp heating unit 130 is provided in the upper wall of chamber 121 including a lamp heater 131 having a plurality of UV lamps, and a transmission window 132. In particular, transmission window 132 is configured to face downward so that a heating-wire is irradiated downwardly through transmission window 132.

A gas introducing inlet 141 is formed in the lateral wall of chamber 121. The gas introducing inlet 141 is connected to a gas introducing pipe 142 which is connected to a gas supply mechanism 143 for supplying an inert gas, such as $N_2$ gas, Ar gas, and He gas.

An exhaust outlet 144 is formed in the lateral wall of chamber 121 at the opposite side of gas introducing inlet 141. Exhaust outlet 144 is connected to an exhaust pipe 145 which is connected to an exhaust device 146 having a vacuum pump. By the operation of exhaust device 146, the inside pressure of chamber 121 is reduced to a predetermined degree of vacuum via exhaust pipe 145.

In such an apparatus, a rapid heating by a lamp-heating, and a rapid cooling by an inert gas can be achieved. Furthermore, a quick annealing process can be realized thereby increasing the throughput. Also, since this unit is a dedicated module for an annealing process, a degree of freedom in processes is relatively high. For example, since the temperature for the annealing process can go higher than that of the wafer formed with a copper film, the carbon and oxygen components in the film may be reduced by the high-temperature annealing.

The cooling unit 103, although not shown, has a simple configuration in which a cooling stage provided with a refrigerant path is disposed within the chamber. The wafer W having a high temperature may be cooled down by the annealing process.

In the system as configured above, the wafer W is taken out from any one of the carriers C and loaded into load/lock chamber 105, by wafer carrying device 116. The wafer W is then carried from load/lock chamber 105 to wafer carrying chamber 104 by wafer carrying device 112. The wafer W is then carried to adsorbing unit 101 where the copper formate is adsorbed on the wafer W. The wafer W formed with the copper formate film with a predetermined thickness, is then taken out from adsorbing unit 101 by wafer carrying device 112, and is loaded into annealing unit 102. The copper formate film is decomposed by lamp-heating and a copper film is formed in the annealing unit 102. Then, the wafer W formed with the copper film is taken out from annealing unit 102 by wafer carrying device 112, and is loaded into cooling unit 103. The wafer W is cooled on a wafer stage to a predetermined temperature. The wafer W which has been cooled in cooling unit 103 is carried to load/lock chamber 106 by wafer carrying device 112, and is loaded again into a predetermined carrier C from load/lock chamber 106 by wafer carrying device 116. A series of successive processes are performed on a plurality of wafers W received in the carriers C.

In this manner, each process may be performed in a different unit, and then the plurality of units may be clustered. Thus, each unit can be dedicated to a specific process thereby improving the throughput, compared to the case where one device performs all processes.

Also, in the present invention, a unit for forming the copper film, and other units including a unit for sputtering may be clustered as shown in FIG. 9.

Also, the present invention is not limited to the above embodiments and various modifications may be made. For example, any other means may be used than the producing and heating means for the copper formate as described above. Also, in the above described embodiments, copper (II) formate and formic acid, or copper (II) formate and copper are used to produce copper formate, and the produced copper formate is supplied to a substrate, and decomposed by energy so as to form a copper film. However, the present invention is not limited thereto. A process may be performed in such a way that a bivalent carboxylic acid metal salt and a carboxylic acid, or a bivalent carboxylic acid metal salt and a metal constituting the metal salt may be used to produce a monovalent carboxylic acid metal salt, and the produced monovalent carboxylic acid metal salt may be formed into a metallic film through decomposition. Also, the present invention is not limited to the copper film but may be directed to another metal film. In this case, the temperature and pressure for producing a monovalent carboxylic acid metal salt, and the temperature for decomposing the monovalent carboxylic acid metal salt for the another metal film may be different from the copper film. Also, while a semiconductor wafer is used as a substrate in the above embodiments, other substrates, such as a glass substrate for a flat panel display (FPD), may be used for processing. Also, it will be understood that the present invention includes within its scope all combinations and subcombinations of these examples.

INDUSTRIAL APPLICABILITY

The method for forming a copper film, according to the present invention, can provide a high-quality film with a good step coverage at a low cost, and thus is appropriate for copper wiring of a semiconductor device.

What is claimed is:

1. A film forming method comprising the steps of:
producing a gas-state monovalent carboxylic acid metal salt by reacting a solid-state bivalent carboxylic acid metal salt with a carboxylic acid using a heat in a vacuum;
forming a layer of solid-state monovalent carboxylic acid metal salt on a substrate as a precursor without thermal decomposition by introducing gas-state monovalent carboxylic acid metal salt on the substrate; and
after forming the layer of solid-state monovalent carboxylic acid metal salt on the substrate, providing energy to the substrate formed with the layer of solid-state monovalent carboxylic acid metal salt, thereby decomposing a carboxylic acid salt in the layer of solid-state monovalent carboxylic acid metal salt on the substrate to form a metallic film on the substrate.

2. The film forming method as claimed in claim 1, wherein the bivalent carboxylic acid metal salt is powdery, to which a carboxylic acid gas or a carboxylic acid liquid is supplied so as to provide the gas-state monovalent carboxylic acid metal salt.

3. The film forming method as claimed in claim 1, wherein the substrate is disposed within a vacuum-maintained processing chamber, and the gas-sate monovalent carboxylic acid metal salt produced by reacting the bivalent carboxylic acid metal salt with the carboxylic acid is introduced into the processing chamber.

4. The film forming method as claimed in claim 1, wherein the metal is selected from the group including copper, silver, cobalt, and nickel.

5. The film forming method as claimed in claim 1, wherein the carboxylic acid is selected from the group including formic acid, acetic acid, propionic acid, valeric acid, and butyric acid.

6. The film forming method as claimed in claim 1, wherein the bivalent carboxylic acid metal salt is copper (II) formate, the carboxylic acid is formic acid, and the monovalent carboxylic acid metal salt gas is copper formate.

\* \* \* \* \*